United States Patent [19]

Huson et al.

[11] Patent Number: 5,315,276

[45] Date of Patent: May 24, 1994

[54] COMPACT SUPERCONDUCTING MAGNET FOR MAGNETIC RESONANCE IMAGING

[75] Inventors: F. Russell Huson; Sergio Pissanetzky, both of The Woodlands, Tex.; John D. Larson, III, Palo Alto, Calif.

[73] Assignee: Hewlett Packard Company, Palo Alto, Calif.

[21] Appl. No.: 827,378

[22] Filed: Jan. 29, 1992

[51] Int. Cl.⁵ .............................................. H01F 7/22
[52] U.S. Cl. .................................... 335/216; 335/301; 324/319
[58] Field of Search ............... 335/216, 296, 297, 298, 335/299, 300, 301, 302, 304, 306; 324/318, 319, 320

[56] References Cited

U.S. PATENT DOCUMENTS

| | | | |
|---|---|---|---|
| 4,651,096 | 3/1987 | Buonocore | 324/309 |
| 4,667,174 | 5/1987 | Mackinnon et al. | 335/299 |
| 4,783,628 | 11/1988 | Huson | 324/320 |
| 4,791,370 | 12/1988 | Mackinnon | 324/318 |
| 4,822,772 | 4/1989 | Huson | 505/1 |
| 4,985,678 | 1/1991 | Gangarosa | 324/318 |

FOREIGN PATENT DOCUMENTS 9004258 4/1990 PCT Int'l Appl. .

OTHER PUBLICATIONS

Everett, et al., "Spherical coils for uniform magnetic fields," *J. Sci. Instrum.* vol. 43 (1966), pp. 470-474.
Yamada, et al., "Superconducting Magnets for Magnetic Reasonance Imaging," *Advances in Superconductivity, Proceedings of the 1st International Symposium on Superconductivity*, (1969) pp. 55-58.

Primary Examiner—Leo P. Picard
Assistant Examiner—Raymond Barrera

[57] ABSTRACT

A C-shaped superconducting magnet for use in magnetic resonance imaging (MRI) equipment is disclosed. The magnet includes flux concentrators on opposing sides of the gap, for generating a vertical field therein; the flux concentrators include a plurality of coils, for carrying current in opposing directions, so as to generate an inwardly directed field to compensate for the gap. Injection correctors, each consisting of a horizontal coil, are disposed adjacent the flux concentrators. A flux return body, for example a superconducting solenoid or an iron yoke, provides a return path on the opposite side of the magnet from the gap. Flux deflectors guide return flux in a curved path from the flux return body to the injection correctors. The flux deflectors are constructed to include a superconducting coil which is wound about varying chords (or the full diameter) thereof, so that the induced flux is greater nearer the outside of the flux deflector, compensating for the tendency of the flux to crowd along the inner portion of the curved path. The return flux is thus provided to the injection correctors with sufficient uniformity to be corrected thereby.

18 Claims, 4 Drawing Sheets

COMPACT SUPERCONDUCTING MAGNET FOR MAGNETIC RESONANCE IMAGING

This invention is in the field of high magnetic field magnets, and is more specifically directed to superconducting magnets for medical imaging.

BACKGROUND OF THE INVENTION

In recent years, significant improvements have been made in medical diagnostic instrumentation, particularly as related to the diagnosis of internal injuries and illnesses. In particular, the field of imaging internal organs and tumors in the diagnostic context has progressed dramatically in recent years.

A widely used modern imaging technique is generally referred to as magnetic resonance imaging (MRI). MRI utilizes the nuclear magnetic resonance (NMR) mechanism available from the nuclei of those atoms which are gyromagnetic (i.e., atomic nuclei that have nonzero angular momentum, or nonzero magnetic moment), the most commonly analyzed of which is hydrogen. MRI is accomplished by placing the subject to be imaged, for example a human, into a DC magnetic field of a magnitude ranging from 0.15 Tesla to 2.0 Tesla for polarizing the gyromagnetic nuclei of interest in the subject. A gradient, or sweep, coil is used to produce a gradient magnetic field within the subject, precisely defining the volume within the subject to be imaged at a particular time; modulation of the gradient field allows for sequential imaging of small volumes so that an image of a larger volume can be produced. As is well known in the art, the gradient field, in combination with the DC field, will define a volume in which the atoms will have a common resonant frequency different from atoms outside of the volume. The MRI apparatus also generally includes an oscillator coil that generates an oscillating magnetic field, oriented at an angle relative to the DC field; the frequency of the oscillating field is selected to match the resonant frequency of the atoms of interest in the selected volume. Frequencies of interest in modern MRI are in the radio frequency range. The MRI apparatus also includes a detecting coil in which a current can be induced by the nuclear magnetic dipoles in the volume being imaged.

In operation, as is well known, the magnetic dipole moments of those atoms in the volume which are both gyromagnetic and also resonant at the frequency of the oscillating field are rotated to some angle, for example 90°, from their polarized orientation by the resonant RF oscillation. Upon removal of the RF excitation, the voltage induced in the detecting coil is measured over time, with the rate of decay corresponding to the quantity of the atoms of interest in the volume being imaged. Sequencing of the selected volume by modulating the gradient field will thus result in an image of the subject which depends upon the density of the resonant nuclei (e.g., hydrogen) at the volumes therein. MRI according to this technique (and its variations) has been successful in the imaging of soft tissues which are transparent to X-rays, such as internal organs and the like.

Generation of large DC magnetic fields has been a particularly difficult problem in conventional MRI equipment. Firstly, imaging is facilitated by the generation of extremely large fields of on the order of at least 1.5 Tesla, for example. Such large magnetic fields require large coil currents or alternatively larger numbers of turns in the main DC magnet coil, each of which have necessitated the use of superconducting material and accompanying cryogenic systems in the magnets which are both relatively costly items. In addition, the size and weight of the MRI apparatus generally increases with the DC field strength of the magnet, as the weight and size of the magnet will increase with its DC field strength. Some conventional MRI magnets are sufficiently heavy (e.g., on the order of twenty tons) as to limit the installation of the MRI apparatus to a basement or ground floor laboratory.

In addition to these cost factors, an important factor in the design and construction of MRI magnets is the uniformity of the magnetic field within the "gap" into which the subject is to be placed, as the precision of the image depends upon the uniformity of the field at the subject location. It has been observed that magnetic field uniformity becomes increasingly difficult to achieve with increasing field strength.

In combination with these cost and uniformity factors, shielding of stray fields from the DC magnet also becomes of major concern, especially as the fields become very large, as the accuracy of conventional electronic instrumentation is adversely impacted by magnetic fields. Many purchasers of MRI equipment thus demand excellent shielding, as the size and cost of the laboratory into which the MRI apparatus is to be installed will depend not only upon the size of the apparatus itself, but also upon the distance that other instrumentation must be kept from the apparatus (or alternatively the external shielding measures required). Use of superconducting coils to provide such shielding can be effective, but of course dramatically increases the cost of the apparatus. Iron shielding, while avoiding the cost of additional superconducting material, results in much larger and heavier magnets, and also must be designed in a highly precise manner, especially for high fields, so that the iron does not adversely affect the uniformity of the field in the imaging volume.

By way of further background, a superferric shielded magnet and method for constructing the same is described in U.S. Pat. No. 4,783,628, issued Nov. 8, 1988, and in U.S. Pat. No. 4,822,772, both incorporated herein by this reference. A superconducting magnet particularly intended for MRI applications, shielded by the combination of a superferric shield and superconducting shielding coils, is described in copending application Ser. No. 715,552, filed Jun. 14, 1991, also incorporated herein by this reference. In each of these magnets, the bore is cylindrical, with the generated DC magnetic field in a direction parallel with the axis of the cylindrical bore.

By way of further background, MRI equipment utilizing a window frame opening into which the subject is placed are described in U.S. Pat. No. 4,791,370, issued Dec. 13, 1988, and U.S. Pat. No. 4,667,174, issued May 19, 1987. In these arrangements, an iron yoke is provided into which upper and lower U-shaped non-superconducting coil assemblies are provided for generating a vertical DC magnetic field within its volume. Gradient coils are inserted thereinto (as described in U.S. Pat. No. 4,791,370) for selecting the slice of the subject to be imaged.

The cylindrical and window frame magnets described hereinabove have each been widely used in MRI equipment intended for human subjects. However, access to the patient is limited in MRI equipment fabricated according to these shapes, particularly in the case of cardiac patients to whom intravenous tubes and cardiac monitoring equipment must remain connected during the MRI procedure. As MRI is a particularly useful diagnostic tool for cardiac disorders, it is therefore highly desirable to provide an MRI apparatus which can easily receive a human subject and yet provide external access to the subject. In addition, MRI equipment using the cylindrical and window frame magnet designs can result in significant patient anxiety, as these shapes require the head of the patient to be enclosed within the magnet during the MRI of many regions of the body.

By way of still further background, C-shaped magnets for generating DC fields are well known in the field of particle acceleration. A well known example of such magnets are those used in cyclotrons to maintain a centripetal acceleration on the accelerated charged particle(s) traveling between the accelerating dee electrodes. Various pole face designs have been utilized in cyclotron magnets in order to properly focus the path traveled by the particle, especially as it is accelerated by the dee electrodes.

By way of further background, a C-shaped magnet for generating a magnetic field intended for use in NMR equipment is described in international publication WO 90/04258, published Apr. 19, 1990, particularly relative to FIG. 3 therein. In the C-shaped magnet described in this document, an iron yoke is provided to serve as a flux guide. An array of modular solenoids are used to generate the field across the gap; the publication also discloses that the modules can be powered to have different energy densities from one another to maximize the efficiency of the array of modules.

It is an object of the present invention to provide a high field DC magnet intended for MRI equipment which provides easy patient access and which does not require the patient to be enclosed within the magnet during the MRI procedure.

As will be described hereinbelow, a C-shaped magnet according to the invention provides excellent patient access, and can also perform MRI of many parts of the human body without enclosing the head area, thus reducing patient anxiety. However, the C-shape of the magnet theoretically provides poor uniformity of return flux to the field generating coils at the gap area. This poor uniformity results from the natural crowding of magnetic flux near the inner surface of a curved flux path (i.e., at the inner surfaces of the top and bottom of the "C"). As high uniformity of field within the imaging volume (e.g., a sphere of 20 cm diameter) is essential in the MRI context for precise imaging, the improved patient access provided by a C-shaped magnet adversely impacts the uniformity of the field in the gap.

It is therefore a further object of the invention to provide such a magnet which has a high degree of field uniformity in the gap.

It is a further object of the invention to provide such a magnet which provides such high field uniformity by correcting for flux crowding in the curved return path.

It is a further object of the invention to provide such a magnet which has a high degree of shielding and low fringe fields.

It is a further object of the invention to provide such a magnet which can be fabricated at relatively low cost.

Other objects and advantages of the present invention will be apparent to those of ordinary skill in the art having reference to the following specification in combination with the drawings.

SUMMARY OF THE INVENTION

The present invention may be incorporated into a C-shaped superconducting magnet having a gap into which the subject to be imaged can be placed. Flux concentrators, including coils at selected distances from one another and of selected polarity, are disposed on either side of the gap in order to generate the necessary DC field and focus its uniformity in the gap. Located next to each flux concentrator, on its side away from the gap, is an injection corrector, constructed for example as a horizontal coil, to finely correct remaining flux non-uniformity for return to the flux concentrators. The magnetic circuit path is closed on each end of the C-shape by flux deflectors, between which is placed a conventional superconducting coil or an iron yoke to complete the circuit. The flux deflectors are capable of presenting a sufficiently uniform field to the horizontal injection correctors that it can be corrected and applied to the flux concentrators for proper shaping in the gap, and to provide sufficiently uniform field to the conventional solenoid or yoke so that the return can be relatively inexpensively fabricated. Excellent shielding is therefore provided in a relatively low cost magnet which has a large gap relative to the pole face diameter, and which produces high DC field of excellent uniformity while allowing good patient access.

DETAILED DESCRIPTION OF THE PREFERRED EMBODIMENTS

Figure 1:
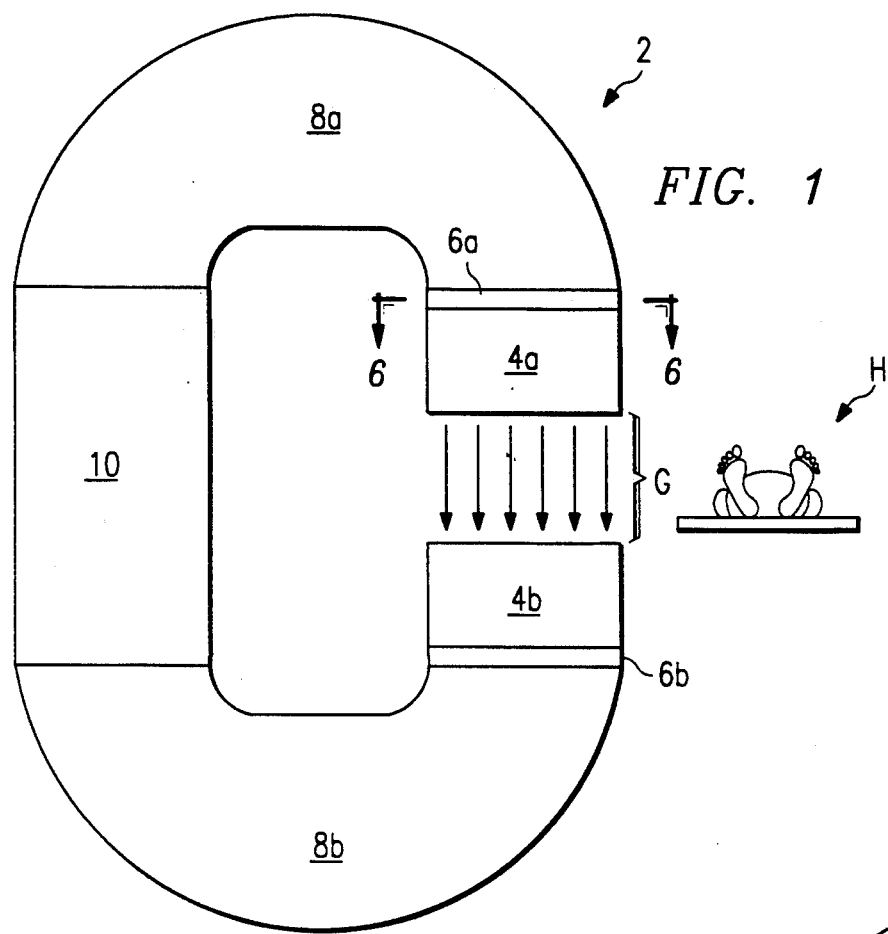
FIG. 1 is an elevation view of a magnet according to the preferred embodiment of the invention.

Referring to FIG. 1, superconducting magnet 2 according to a first preferred embodiment of the invention will now be described in detail. Magnet 2 has a C-shape, as is evident from FIG. 1, in that it is closed on three sides (viewed from a side elevation) and has gap G on a fourth, into which the subject to be imaged is placed. In this embodiment, a high magnitude and highly uniform vertically oriented DC magnetic field (shown by the flux lines in FIG. 1) is generated across gap G by superconducting flux concentrators 4a, 4b in the manner described hereinbelow. For purposes of high resolution medical MRI of human internal body organs, such as the heart, the magnitude of the magnetic field of this example of magnet 2 is contemplated to be on the order of 2.0 Tesla, for example.

Located adjacent each of flux concentrators 4a, 4b are injection correctors 6a, 6b, respectively, each of which are horizontally oriented superconducting coils for finely correcting the uniformity of return flux to flux concentrators 4a, 4b; the construction of injection correctors 6a, 6b will be described in detail hereinbelow relative to FIG. 6. On the opposite side of magnet 2 from gap G, in this example, is return solenoid 10 which, in this example, is a conventional cylindrical superconducting solenoid.

The magnetic circuit of magnet 2 according to this embodiment of the invention is completed by flux deflectors 8a, 8b, located between return solenoid 10 and injection correctors 6a, 6b, respectively, each forming a curved portion of the C shape of magnet 2. Flux deflectors 8a, 8b each are superconducting coils constructed in such a manner as to direct the return flux from return solenoid 10 in a substantially uniform manner to injection correctors 6a, 6b, and flux concentrators 4a, 4b, respectively. The detailed construction of flux deflectors 8a, 8b will be discussed hereinbelow.

Magnet 2 is constructed so that its support structure is contained within flux deflectors 8a, 8b and return solenoid 10. Examples of such support structure would include stainless steel I-beams included within the volume of magnet 2; ferromagnetic material such as iron should not be used in the support structure, as such material could short circuit the magnetic flux. In addition, flux deflector 8b (and flux deflector 8a, for symmetry) preferably has a flat bottom so that it is stable when placed on a laboratory floor.

The interior of magnet 2, including return solenoid 10, flux deflectors 8a, 8b, injection correctors 6a, 6b, and flux concentrators 4a, 4b, is to be maintained at a sufficiently low temperature to enable superconductivity of the coil material therein. Accordingly, these elements of magnet 2 can be formed as a single cryostat, with the conventional cryogenic system (not shown) for cooling this volume located externally therefrom. Inclusion of mechanical support structures within the volume of return solenoid 10 and flux deflectors 8a, 8b reduces heat loss from the cryostat, and also eliminates the transmission of mechanical forces (due to the magnetic field) across cryogenic boundaries, thus reducing the mechanical requirements for support of magnet 2. As shown in FIG. 1 for magnet 2 (and in FIG. 5 for magnet 2' described hereinbelow), the illustrated boundaries correspond to cryostat boundaries, with the superconducting coils described hereinbelow being located and mounted therewithin.

Alternatively, external support structure may be provided to stably support magnet 2 in the orientation of FIG. 1; of course, such external structure will increase the laboratory space required for the apparatus.

This embodiment of magnet 2 is intended for use in the magnetic resonance imaging (MRI) of human subjects. As such, the additional coils necessary for conventional MRI are included within gap 2, in the conventional manner. Such coils include the gradient (or sweep) coil, the RF coil for generating the resonant perpendicular magnetic field, and the detection coil, each of which will be located within or adjacent to gap G in the conventional manner; these coils are not shown in FIG. 1 for purposes of clarity.

The width of gap G is preferably as large as possible while still allowing for a uniform high magnetic field; in this example, gap G is at least 50 cm in width, and is thus able to receive a human subject entering from the right side of magnet 2 in a horizontal position. This example of magnet 2 is contemplated to have a total height of on the order of 320 cm, and a width of on the order of 210 cm. The centerline of gap G is thus on the order of 160 cm above the floor surface. Flux concentrators 4a, 4b each have a circular cross-section of a diameter of on the order of 70 cm. As a result, human subject H may be placed into gap G (with the head-to-toe axis being into and out of the page of FIG. 1) for MRI of a thoracic internal organ such as the heart without requiring enclosure of the head or groin area by the magnet. Magnet 2 thus allows continuous access to the human subject during the MRI procedure, and also reduces patient anxiety by not fully enclosing the human subject therewithin.

Figure 2:
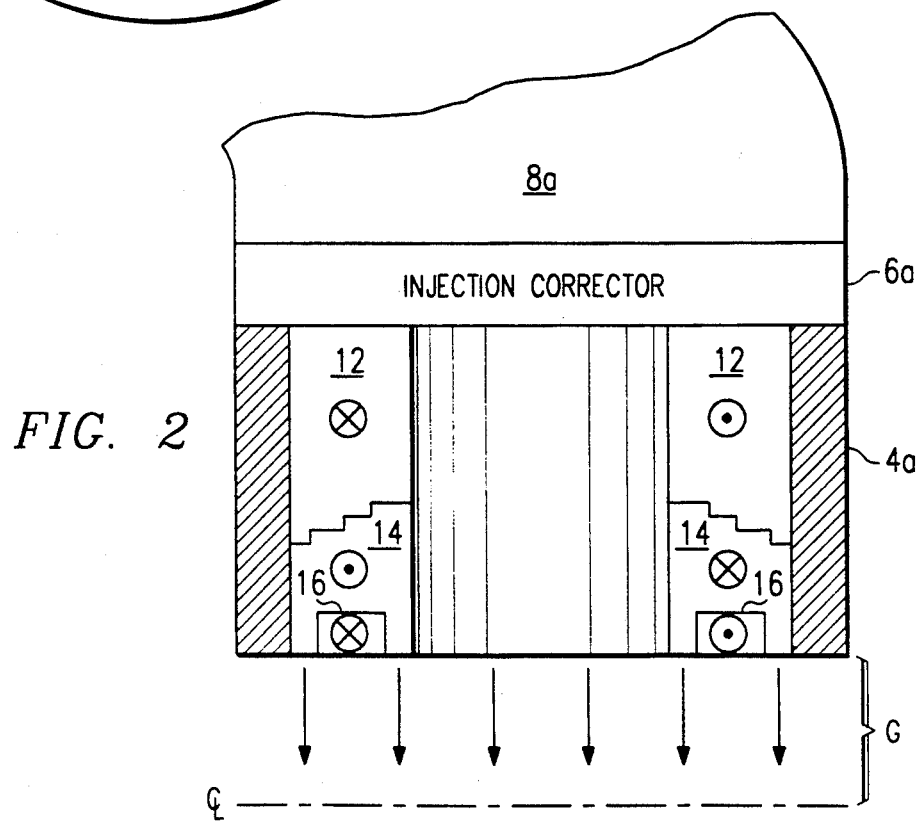
FIG. 2 is a cross-sectional diagram of one of the flux concentrators in the magnet of FIG. 1.

Referring now to FIG. 2, the construction of superconducting flux concentrators 4a, 4b will now be described relative to a cross-sectional view of flux concentrator 4a. As noted hereinabove, flux concentrator 4a generates a high magnetic field (e.g., on the order of 2.0 Tesla) which is highly uniform in gap G thereunder (e.g., on the order of 1 ppm over the imaging volume of interest in gap G). In this embodiment of the invention, flux concentrator 4a includes multiple superconducting coils 12, 14, 16, shown in cross-section in FIG. 2, oriented and sized to generate the uniform strong field (current out of the page indicated by the dot, and current into the page indicated by the cross). The number, sizing, and relative location of opposing coils 12, 14, 16 will of course depend upon the construction of an individual magnet, of course, and can be determined by way of conventional computer modeling.

As is well known, magnetic field lines (i.e., lines of equal magnetic force in a magnetic field) tend to follow the shortest possible path, but also tend to repel one another. The magnetic field within a infinitely long solenoid will therefore be highly uniform; accordingly, long solenoids have been attractive for use in MRI equipment. If a midplane gap is present within a solenoid, however, the magnetic field lines will bulge out of the gap, due to their repulsion relative to one another.

In C-shaped magnet 2, such bulging would occur at gap G if flux concentrators 4a, 4b were designed as conventional solenoids. In this embodiment of the invention, however, each of flux concentrators 4a, 4b are designed to produce higher magnetic field near their outer edges, such higher field tending to confine the field nearer the center of gap G so that the overall field in gap G is highly uniform, compensating for the tendency of the field lines to bulge out of gap G.

In this example, such confinement is accomplished by the shape of large coil 12, which generates the majority of the field, having a portion of its outer edge nearer gap G than its inner edge. Coil 14 is disposed adjacent to, and nearer gap G than, coil 12, and conducts current in an opposing direction to that of coil 12. Small coil 16 is disposed within coil 14, adjacent gap G, and conducts current in the same direction as large coil 12 (opposing that conducted by coil 14).

Also in this example, it is desirable to maintain the superconduction in flux concentrators 4a, 4b in persistent mode. According to conventional superconduction technology, the largest capacity persistent switches can handle up to 500 amperes, and therefore the superconducting current in each of coils 12, 14, 16 must be limited to this magnitude. Accordingly, in this example, each of coils 12, 14, 16 is constructed of multiple turns of relatively small insulated round superconducting wire. An example of a superconducting wire useful in coils 12, 14, 16 is round superconducting wire of approximately one millimeter in diameter, consisting of 2.3 to 2.5 parts copper stabilizer to one part niobium-titanium alloy. The wire preferably has an insulating coating of a polyimide tape, with the individual insulated wires not bonded to one another within coils 12, 14, 16 so that the chilled coolant may flow through the coil to maintain the wire temperature at a temperature compatible with its superconductivity. Alternatively, the coils may be potted, so that the individual wires therein are bonded to one another.

Flux concentrator 4b is, of course, constructed similarly as flux concentrator 4a, and with the same current polarities, so as to cooperate with flux concentrator 4a in producing a vertical magnetic field in gap G.

With the superconducting wire constructed in this manner, for a 2.0 Tesla field across a 50 cm gap and with pole face diameters of on the order 70 cm, the current density within flux concentrator 4a will be on the order of 40 kA/cm$^2$. Coil 12 will accordingly have on the order of 44,000 turns, coil 14 will have on the order of 14,000 turns, and coil 16 will have on the order of 1,800 turns. The total weight of superconductor in flux concentrators 4a, 4b will thus be on the order of 1800 pounds each.

The uniformity of magnetic field across gap G resulting from such construction of flux concentrators 4a, 4b has been simulated to be well below 10 ppm within an imaging sphere of 20 cm diameter, at a field of 2.0 Tesla. Conventional trim coils may be incorporated into magnet 2 near gap G in the conventional manner, and are expected to improve the field uniformity to within 1 ppm.

As a result of this construction of flux concentrators 4a, 4b, the ratio of gap size to pole face diameter is quite high. Since overall magnet size is a strong function of the pole face diameter, the present invention thus allows for the construction of a compact magnet which has sufficient gap width to be useful in medical MRI equipment. The excellent patient access provided by the present invention is particularly beneficial in cardiac imaging, as cardiac patients generally require significant external monitoring and intravenous access to be maintained during the MRI procedure.

In order for this high uniformity and high field to be generated by flux concentrators 4a, 4b, the return flux from the remainder of the magnetic circuit of magnet 2 must be presented to flux concentrators 4a, 4b in a highly uniform manner. In this embodiment of the invention, such return is provided by return solenoid 10 in combination with flux deflectors 8a, 8b and injection correctors 6a, 6b. Return solenoid 10 in the example described herein is approximately 140 cm long and 70 cm in diameter, and includes on the order of 310 pounds of superconductor carrying a current density of on the order of 83 kA/cm$^2$, generating a field of on the order of 6.0 Tesla.

According to conventional designs, the deflection of magnetic flux along a curved path is difficult to achieve in such a manner as to provide uniform field at the exit from the path. This difficulty is due to the magnetic field becoming higher at the inside of the turn than at the outside, in a manner which is proportional to the ratio of the radii of curvature of the outer and inner boundaries of the circuit. Highly uniform exiting field can be provided by increasing the radius of curvature of the circuit (so that the ratio between the outer and inner radii of curvature is closer to unity); for MRI equipment, however, the resulting increase in the size of the magnet from this approach is extremely costly and thus undesirable. Large high current capacity superconducting coils may alternatively be used in order to deflect the return flux around a close loop, but such coils are extremely costly to construct, also increasing the cost of the MRI equipment to prohibitive levels. In addition, as the fields become high, quenching can occur at the inner radius of the deflector where superconducting coils are used, in conventional arrangements, to deflect the return flux.

Figure 3:
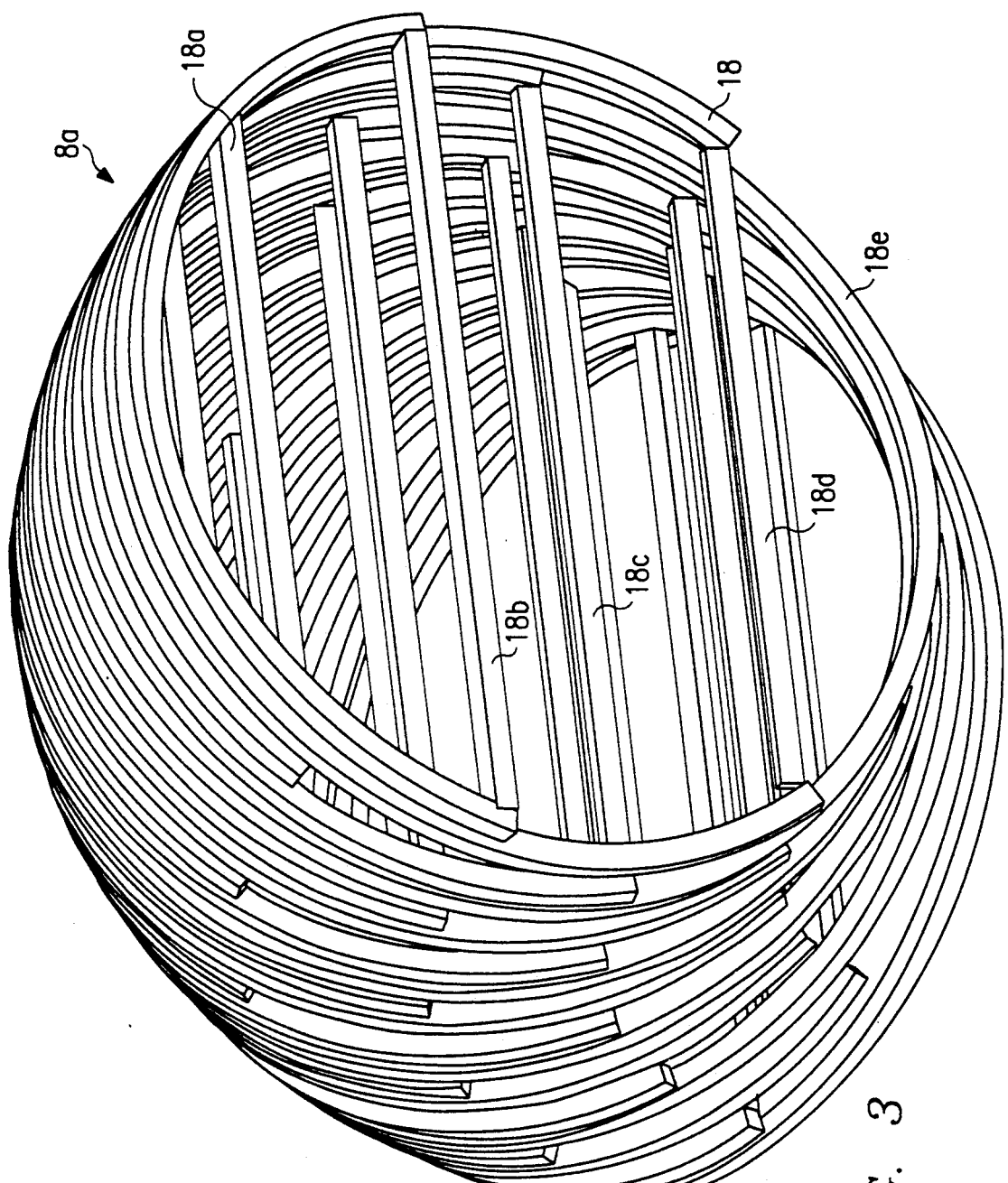
FIG. 3 is a perspective view of a flux deflector in the magnet of FIG. 1.
Figure 4A:
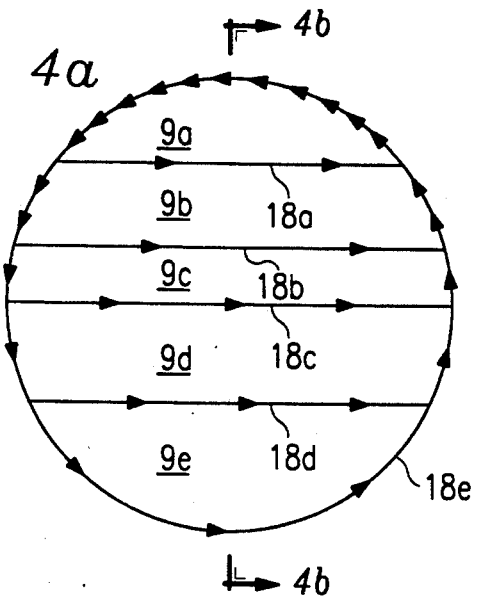
FIGS. 4a and 4b are cross-sectional diagrams of the flux deflector of FIG. 3.
Figure 4B:
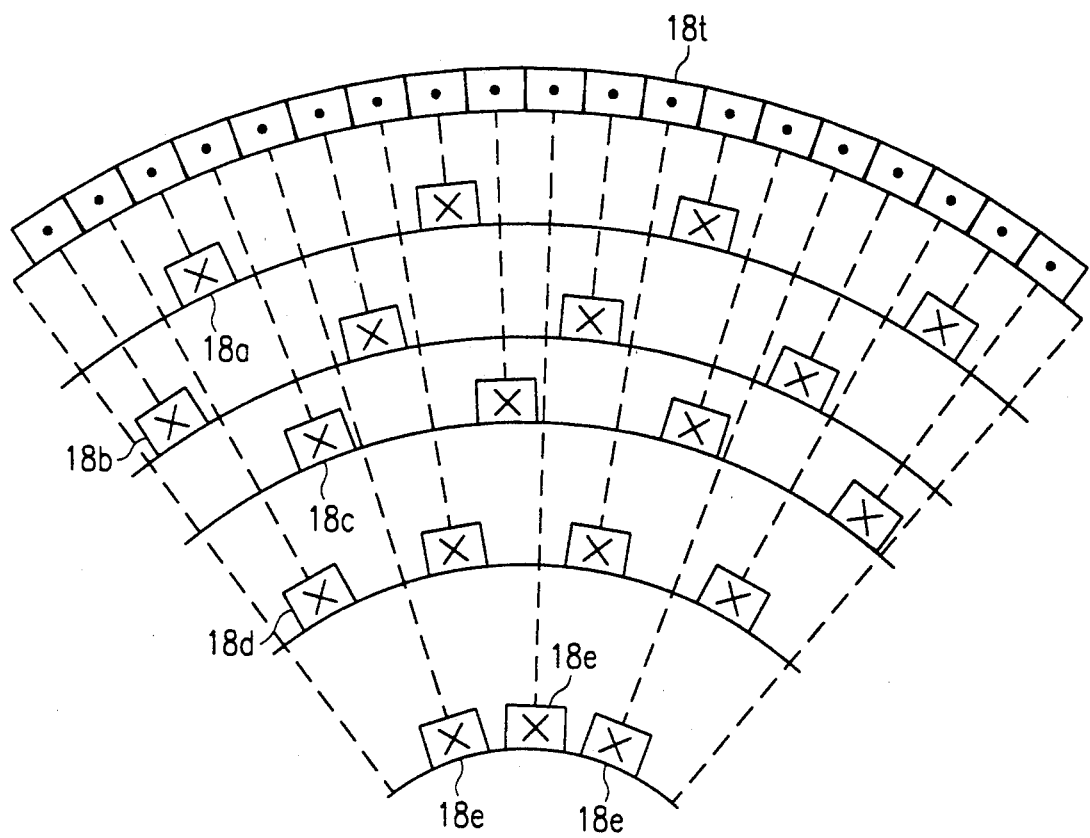

Referring now to FIGS. 3, 4a, 4b, the construction of flux deflectors 8a, 8b according to the preferred embodiment of the invention will be described in detail. Referring first to the perspective view of FIG. 3, flux deflector 8a according to this embodiment of the invention is a partial toroid defined by a number of turns of superconducting wire 18. Superconducting wire is preferably constructed as described hereinabove relative to flux concentrators 4a, 4b. The turns of superconducting wire 18 are arranged so that the current density per unit of cross-sectional area of flux deflector 8a increases toward the outer perimeter of the torus of flux deflector 8a. The return flux is thus guided by flux deflector 8a toward its outer perimeter, counter to the natural crowding of the flux that occurs in a conventional solenoid having a toroidal shape.

Referring now to FIGS. 4a and 4b in combination, the arrangement of superconducting wire 18 in flux deflector 8a will be described in detail. FIG. 4a is a cross-section of flux deflector 8a, taken across a diameter thereof; FIG. 4b is an arc section of the partial toroid of flux deflector 8, taken in a perpendicular direction relative to FIG. 4a.

In flux deflector 8a according to this embodiment of the invention, successive turns of superconducting wire 18 vary in diameter along the length of flux deflector 8a, with each turn having an outer side coincident with the outer perimeter of flux deflector 8a. In this example, four chords across the cross-section of flux deflector 8a define five regions 9a through 9e, with region 9e at the outer edge of the toroid of flux deflector 8a. In this example, the perimeter of flux deflector 8a of FIG. 4a subtended by the chords defining portions 9a through 9d are approximately 90°, 150°, 180° and 240°, respectively.

In flux deflector 8a, superconducting wire 18 is wound in an alternating manner along the defining chords. Beginning from the left in FIG. 4b, the first turn of superconducting wire 18 includes a portion 18t carrying current (out of the page of FIG. 4b) and along the outer perimeter of flux deflector 8a; the return portion 18b of the first turn carries current (into the page of FIG. 4b) along the second chord from the outer edge, thus enclosing portions 9a and 9b. The next turn of superconducting wire includes a portion 18t along the outer edge and a return path 18d, encircling portions 9a through 9d. The third and fourth turns from the left illustrated in FIG. 4b each have a portion 18t along a portion of the outer perimeter of flux deflector 8a, and return portions 18a, 18c, respectively; only outermost portion 9a is enclosed within the third turn, while portions 9a through 9c are enclosed by the fourth turn. The fifth turn includes portions 18t and 18e, and thus encircles the entirety of the cross-section of flux deflector 8a (i.e., all portions 9a through 9e). This winding pattern continues along the full length of flux deflectors 8a, 8b, resulting in five subpaths within flux deflector 8a defined by the cross-sectional portions 9a through 9e thereacross.

This winding arrangement, with the subpath defined by portion 9a within every turn and the subpath defined by portion 9e within only every fifth turn (subpaths corresponding to portions 9b through 9d within varying numbers of turns from every second to every fourth to provide a smooth gradient), will compensate for the natural crowding of magnetic flux toward the inner radius of flux deflector 8a due to its curvature. As a result, approximately the same field will be present within each of portions 9a through 9e of flux deflector 8a, so that relatively uniform field will be present at the interface between flux deflector 8a and injection corrector 6a.

For the example of the 2.0 Tesla magnet described herein, it is contemplated that each flux deflector 8a, 8b will include 480 pounds of superconducting wire 18, will have a maximum current density (in portion 9a) of on the order of 83 kA/cm$^2$, in which the magnetic field generated will be on the order of 6.0 Tesla. The density of turns of superconducting wire 18 (measured at outer portions 18t), will be on the order of 95 cm$^{-1}$ in this example.

In operation, the conduction of current by superconducting wire 18 in flux deflector 8a will compensate for the natural return flux crowding along the inner edge of the curved partial toroid of flux deflector 8a; flux deflector 8b similarly compensates for flux non-uniformity on the bottom of magnet 2 of FIG. 1. For purposes of efficient and low cost construction, however, flux deflectors 8a, 8b need not be manufactured to provide the ultimate uniformity desired at gap G (e.g., on the order of 1 ppm variation), but need only compensate for flux crowding to an extent correctable by injection correctors 6a, 6b, respectively.

Figure 6:
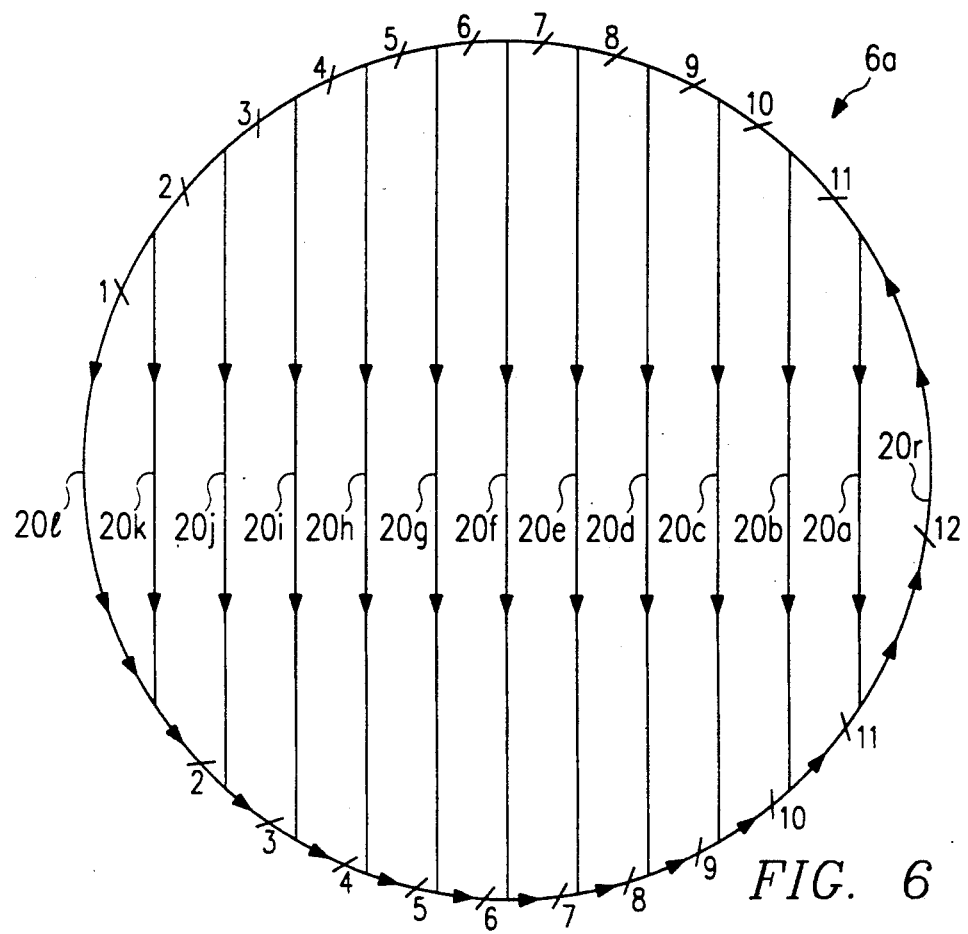
FIG. 6 is an electrical diagram, in schematic form, of an injection corrector coil in the magnet of FIG. 1.

Referring now to FIG. 6, an example of the construction of injection corrector 6a will now be described in detail. Injection corrector 6a according to this embodiment of the invention is preferably constructed as a flat coil, having its turns in a plane perpendicular to the main direction of flux at the interface between it and flux deflector 8a. In this example, injection corrector 6a includes twelve turns 20 of differing cross-sectional area, each having an individual path 20a through 20l along a chord of a circle; of course, the number of turns may be higher, for example from sixteen to twenty, depending upon the precision of correction required. As shown in FIG. 6, all twelve turns 20 has its return path in bus 20r along a common side of the circular coil. It is preferred that the position of each of the chords 20a, through 20l be somewhat variable, so that the flux uniformity can be individually tuned for each magnet 2; selection of the nominal positions (and, perhaps, the final positions) of chords 20a through 20l can be determined by way of computer modeling of the field behavior for magnet 2. As a result of this construction, similarly as described hereinabove relative to flux deflector 8a, injection corrector 6a has a non-uniform number of circumscribing turns per unit cross-sectional area. The example shown in FIG. 6 is for the case where flux deflector 8a has undercorrected the crowding effect, and as such the area near the outer toroid radius is within the greatest number of turns in this example; of course, if flux deflector 8a has overcorrected the crowding, injection corrector 6a would have the area near the inner radius within the greatest number of turns. The polarity of the current through turns 20 may also be used to effect the desired adjustment for overcorrection and undercorrection.

It is contemplated that injection corrector 6a may be constructed so that all of its twelve (in this example) turns 20 are in series in a continuous loop, with the location of the chords of the individual paths 20a through 20l selected to finely compensate for any non-uniformity in the return flux as provided thereto by flux deflector 8a. Alternatively, particularly in manufacturing prototypes, it may be preferred that each turn 20 be electrically isolated from the others, with individually controllable power supplies, so that the current carried by each turn 20 can be adjusted to compensate for the flux non-uniformity. In either case, it is contemplated that the current required to be carried by each turn in injection correctors 6a, 6b will be substantially less than that required in flux deflectors 8a, 8b, and as such the wires in turns 20 may be substantially thinner than those described hereinabove. The low level of current that is contemplated to be required for injection correctors 6a, 6b also indicates that the field quality will not be highly sensitive to the particular location of the paths 20a through 20l. This also makes the construction of injection correctors 6a, 6b relatively inexpensive, while still allowing highly precise fine tuning of the field, as the flux presented to injection correctors 6a, 6b by flux deflectors 8a, 8b, respectively, is relatively uniform.

Further in the alternative, injection correctors 6a, 6b may be constructed similar to that of conventional pole face windings as used in cyclotrons and the like. Further in the alternative, the turns may be arranged in rectangular fashion, rather than circular, and the current density may also be varied in tangential rather than radial directions to account for nonuniformities.

As a result of flux deflectors 8a, 8b constructed according to the present invention, it is contemplated that the uniformity of return flux at the interface between each of flux deflectors 8a, 8b and its adjacent injection corrector 6a, 6b, respectively, will be sufficient that horizontal (i.e., two-dimensional) injection correctors 6a, 6b as described above can correct the remaining non-uniformity to a sufficient degree that flux concentrators 4a, 4b can generate a highly uniform field in gap G. The provision of two-dimensional injection correctors 6a, 6b also helps limit the cost of flux deflectors 8a, 8b, as the uniformity of flux therefrom need not be exact; flux deflectors 8a, 8b therefore need not be fabricated to the highest precision.

In addition, it is also contemplated that the uniformity of return flux at the interface between return solenoid 10 and each of flux deflectors 8a, 8b will also be sufficient that return solenoid 10 can be a conventional cylindrical superconducting solenoid; a uniform flux provided to such a conventional solenoid will thus ensure that the stray field leakage therefrom is minimal.

Of course, the location of the chords defining portions 9a through 9e of flux deflectors 8a, 8b will depend upon many factors, including the radii of curvature, the field strength, the superconducting material available, and the like. It is contemplated that one of ordinary skill in the art having reference to this description will be able to model and select the number and location of these chords accordingly.

Flux deflectors 8a, 8b, as noted hereinabove, also enable the use of lower-cost components such as horizontal coil injection correctors 6a, 6b, and as a conventional return solenoid 10 in magnet 2, while still preventing significant leakage; indeed, the leakage at gap G is expected to dominate the stray fields from magnet 2 according to this embodiment of the invention. These advantages are obtained even for quite sharp turns at the top and bottom of magnet 2, as it is contemplated that the lateral distance between the inner edge of gap 2 and return solenoid is limited only by the space required to comfortably place the patient in gap G. Due to the limited stray fields from magnet 2 according to the present invention, it is contemplated that external shielding will not be required.

Flux concentrators 4a, 4b in this embodiment of the invention also provide a high magnitude and uniformity field across a relatively large gap (e.g., on the order of 60 cm) with a relatively small pole face (e.g., diameter of on the order of 70 cm). In addition, it is contemplated that the mechanical support structures can be included within the volume of return solenoid 10 and flux deflectors 8a 8b, so that mechanical forces are not transmitted across cryogenic boundaries, and so that heat loss from the cryostat is reduced. The present invention thus provides a high degree of shielding in a high field, high uniformity superconducting magnet which occupies a small area and utilizes relatively low cost components.

Figure 5:
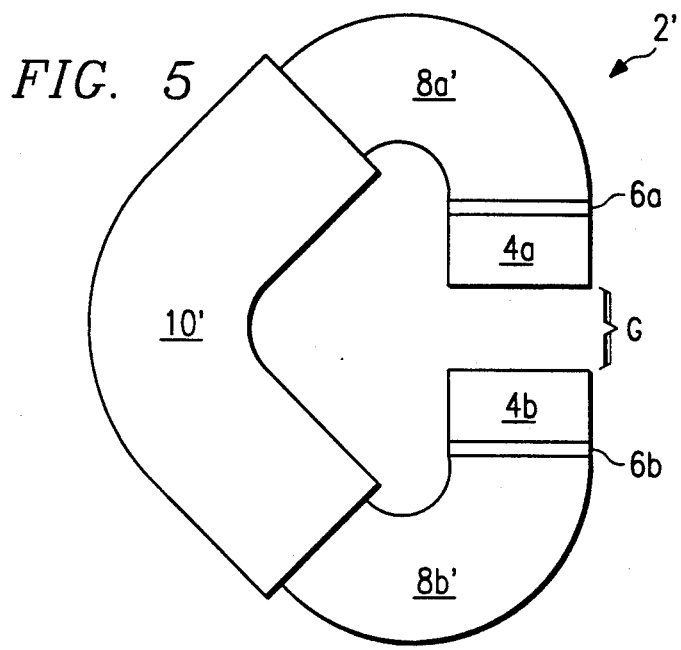
FIG. 5 is an elevation view of a magnet according to an alternative embodiment of the invention.

Referring now to FIG. 5, magnet 2' according to a second preferred embodiment of the invention will now be described in detail. As in the case of magnet 2 of FIG. 1, magnet 2' of this embodiment of the invention generates a high vertical magnetic field across gap G, generated by flux concentrators 4a, 4b constructed as described hereinabove. Injection correctors 6a, 6b are disposed adjacent each of flux concentrators 4a, 4b as described hereinabove.

In this embodiment of the invention, however, iron yoke 10' is provided in place of return solenoid 10, encompassing much of the return portion of the magnetic circuit of magnet 2'. Iron yoke 10' is preferably constructed according to conventional techniques, including the use of parallel sheets of iron therewithin to minimize the generation of eddy currents in yoke 10'. For the example of a 2.0 Tesla magnet, iron yoke 10' may have a diameter of on the order of 100 cm, and may weigh on the order of 23 tons. The width of magnet 2', from the outer edge of gap G to the point of yoke 10', would be on the order of 275 cm, and its height would be on the order of 320 cm.

Disposed between yoke 10', on the one hand, and injection correctors 6a, 6b, on the other hand, are flux deflectors 8a', 8b', respectively. Flux deflectors 8a', 8b' are constructed as described hereinabove relative to magnet 2, but are of course modified in order to accommodate the shape of yoke 10'. It is contemplated that the number and location of the chords within flux deflectors 8a', 8b' will be somewhat different from that described above for magnet 2, but that such selection may be made by one of ordinary skill in the art having reference to this description, and considering the angle of deflection required.

As in the case of return solenoid 10 in magnet 2 described hereinabove, a high degree of precision in the construction and performance yoke 10' is not essential, as flux deflectors 8a', 8b' can provide return flux of sufficient uniformity to horizontal coil injection correctors 6a, 6b as to be correctable thereby, prior to its return to flux concentrators 4a, 4b. As a result, the overall cost of magnet 2' can be kept relatively low, as compared to superconducting magnets constructed in the conventional manner.

Magnet 2', while having a larger "footprint" than that of magnet 2 described hereinabove, can be constructed at a lower cost considering the reduction in the amount of superconducting material required, as the return solenoid is eliminated and as the length of the flux deflectors is reduced. In addition, the advantages of high field strength and high uniformity across a relatively large gap, while maintaining a relatively small pole face diameter, as described hereinabove relative to magnet 2 are also obtained from magnet 2' of FIG. 5 including iron yoke 10'. In addition, particularly where laboratory space is not at a premium, it is contemplated that magnet 2' including iron yoke 10' may be preferable to fully superconducting magnet 2, in some MRI applications.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A superconducting magnet, comprising:
    first and second superconducting coils, for generating a magnetic field across a gap therebetween;
    first and second correction coils, disposed adjacent said first and second superconducting coils, respectively, on the opposing side thereof from said gap;
    a magnetic return having first and second ends;
    a first flux deflector, disposed between a first end of said magnetic return and said first correction coil, for guiding return magnetic flux between said magnetic return and said first correction coil; and
    a second flux deflector, disposed between a second end of said magnetic return and said second correction coil, for guiding return magnetic flux between said magnetic return and said second correction coil.

2. The magnet of claim 1, wherein said magnetic return comprises a cylindrical solenoid.

3. The magnet of claim 2, wherein said cylindrical solenoid comprises a superconducting coil.

4. The magnet of claim 1, wherein said magnetic return comprises an iron yoke.

5. The magnet of claim 1, wherein said first and second flux deflectors define a flux path having a non-zero angle;
    and wherein said first flux deflector comprises:
        a superconducting coil having a plurality of turns arranged in such a manner that the total flux density is substantially constant across the cross-section of the first flux deflector.

6. The magnet of claim 5, wherein said superconducting coils in said first flux deflector is arranged so as to define first and second subpaths within said flux path, said first subpath disposed nearer the outside of the flux path than said second subpath;
    and wherein the number of turns of said superconducting coil around said first subpath is greater than the number of turns of said superconducting coil around said second subpath.

7. The magnet of claim 5, wherein said first correction coil comprises a superconducting coil disposed perpendicularly to the return flux at the location between said first correction coil and said first flux deflector.

8. The magnet of claim 1, wherein said first and second superconducting coils each comprise:
    a first plurality of turns for conducting current in a first direction;
    a second plurality of turns for conducting current in a second opposing direction, said second plurality of turns disposed nearer said gap than said first plurality of turns.

9. The magnet of claim 8, wherein the number of turns in said first plurality of turns is greater than the number of turns in said second plurality of turns.

10. The magnet of claim 8, wherein said first and second superconducting coils each further comprise:
a third plurality of turns for conducting current in said first direction, having a number of turns fewer than said second plurality of turns, and disposed nearer said gap than said second plurality of turns.

11. The magnet of claim 8, wherein said first plurality of turns are arranged at varying diameters;
and wherein the nearest of said first plurality of turns to said gap is of the largest diameter.

12. A C-shaped superconducting magnet, comprising:
first and second flux concentrators, disposed on a first side of said magnet and on opposing sides of a gap therebetween, for generating a vertical magnetic field in said gap;
first and second injection correctors, disposed adjacent said first and second flux concentrators, respectively, opposite from said gap;
a magnetic flux return, forming a second side of said magnet;
a first flux deflector, forming the top of said magnet, for guiding return magnetic flux along a curved path between the top of said magnetic flux return and said first injection corrector;
a second flux deflector, forming the bottom of said magnet, for guiding return magnetic flux along a curved path between the bottom of said magnetic flux return and said second injection corrector.

13. The magnet of claim 12, wherein said first and second flux deflectors each comprise a superconducting coil having a plurality of turns arranged in such a manner that the number of turns around an outer portion of said curved path is greater than the number of turns around an inner portion of said curved path.

14. The magnet of claim 13, Wherein said injection correctors each comprise a superconducting coil disposed substantially horizontally.

15. The magnet of claim 12, wherein said magnetic flux return comprises a cylindrical solenoid.

16. The magnet of claim 15, wherein said cylindrical solenoid comprises a superconducting coil.

17. The magnet of claim 12, wherein said magnetic flux return comprises an iron yoke.

18. The magnet of claim 12, wherein said first and second flux concentrators each comprise:
a first coil, comprising a plurality of turns of superconducting wire, conducting current in a first direction;
a second coil, comprising a plurality of turns of superconducting wire, conducting current in a second direction opposing said first direction;
wherein said second coil is disposed nearer said gap than said first coil;
and wherein the number of turns in said second coil is fewer than the number of turns in said first coil.

* * * * *